US009558947B2

(12) United States Patent
Wallace et al.

(10) Patent No.: US 9,558,947 B2
(45) Date of Patent: Jan. 31, 2017

(54) PATTERN DECOMPOSITION LITHOGRAPHY TECHNIQUES

(75) Inventors: Charles H. Wallace, Portland, OR (US); Hossam M. Abdallah, Portland, OR (US); Elliot N. Tan, Portland, OR (US); Swaminathan Sivakumar, Portland, OR (US); Oleg Golonzka, Beaverton, OR (US); Robert M. Bigwood, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 114 days.

(21) Appl. No.: 13/976,082

(22) PCT Filed: Dec. 29, 2011

(86) PCT No.: PCT/US2011/067930
§ 371 (c)(1),
(2), (4) Date: Jun. 26, 2013

(87) PCT Pub. No.: WO2013/101108
PCT Pub. Date: Jul. 4, 2013

(65) Prior Publication Data
US 2014/0117488 A1    May 1, 2014

(51) Int. Cl.
| | |
|---|---|
| H01L 21/312 | (2006.01) |
| H01L 21/263 | (2006.01) |
| H01L 21/027 | (2006.01) |
| G03F 7/20 | (2006.01) |
| H01L 21/02 | (2006.01) |
| H01L 27/02 | (2006.01) |
| G03F 1/50 | (2012.01) |
| G03F 7/00 | (2006.01) |
| G03F 7/40 | (2006.01) |

(52) U.S. Cl.
CPC ............ *H01L 21/2633* (2013.01); *G03F 1/50* (2013.01); *G03F 7/0035* (2013.01); *G03F 7/40* (2013.01); *G03F 7/70741* (2013.01); *H01L 21/0273* (2013.01); *H01L 21/02345* (2013.01); *H01L 27/0207* (2013.01)

(58) Field of Classification Search
CPC .......................... H01L 21/31; H01L 21/0273
USPC ................................................. 430/394, 317
See application file for complete search history.

(56) References Cited

U.S. PATENT DOCUMENTS

| | | | |
|---|---|---|---|
| 2008/0241734 A1* | 10/2008 | Liu .................... | H01L 21/0334 430/253 |
| 2009/0040483 A1* | 2/2009 | Deng .................... | G03B 27/42 355/52 |
| 2009/0155715 A1 | 6/2009 | Chen et al. | |
| 2009/0203224 A1* | 8/2009 | Shih et al. .................... | 438/780 |
| 2010/0167537 A1 | 7/2010 | Aton | |
| 2011/0023002 A1* | 1/2011 | Cheng et al. ................. | 716/126 |
| 2011/0223541 A1* | 9/2011 | Lee .................... | H01L 21/0273 430/314 |

FOREIGN PATENT DOCUMENTS

| | | |
|---|---|---|
| JP | 2002055432 A | 2/2002 |
| JP | 2008192774 A | 8/2008 |
| WO | 2013/101108 A1 | 7/2013 |

OTHER PUBLICATIONS

International Search Report and Written Opinion received for PCT Patent Application No. PCT/US2011/067930, mailed on Sep. 27, 2012, 12 Pages.
International Preliminary Report on Patentability for Application No. PCT/US2011/067930, mailed on Jul. 10, 2014, 8 pages.

* cited by examiner

*Primary Examiner* — Daborah Chacko Davis
(74) *Attorney, Agent, or Firm* — Finch & Maloney PLLC

(57) ABSTRACT

Techniques are disclosed for realizing a two-dimensional target lithography feature/pattern by decomposing (splitting) it into multiple unidirectional target features that, when aggregated, substantially (e.g., fully) represent the original target feature without leaving an unrepresented remainder (e.g., a whole-number quantity of unidirectional target features). The unidirectional target features may he arbitrarily grouped such that, within a grouping, all unidirectional target features share a common target width value. Where multiple such groupings are provided, individual groupings may or may not have the same common target width value. In some cases, a series of reticles is provided, each reticle having a mask pattern correlating to a grouping of unidirectional target features. Exposure of a photoresist material via the aggregated series of reticles substantially (e.g., fully) produces the original target feature/pattern. The pattern decomposition techniques may be integrated into any number of patterning processes, such as litho-freeze-litho-etch and litho-etch-litho-etch patterning processes.

16 Claims, 5 Drawing Sheets

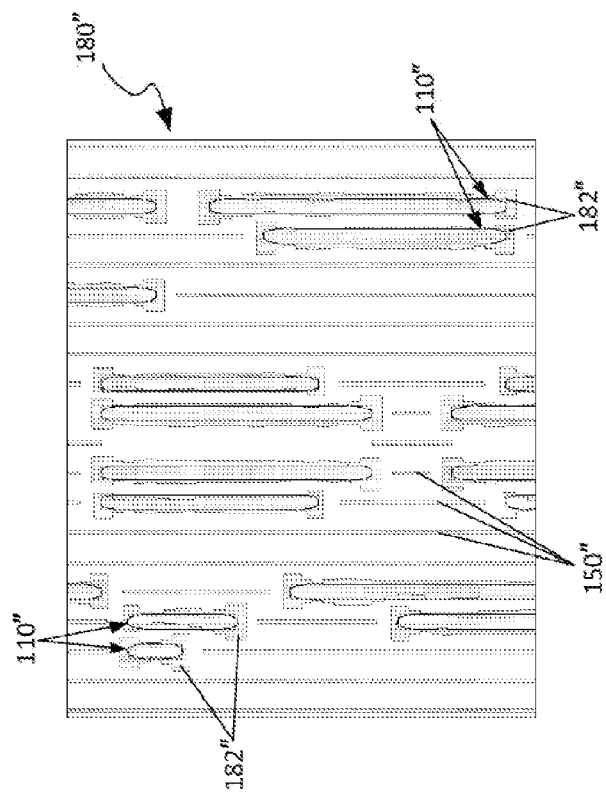
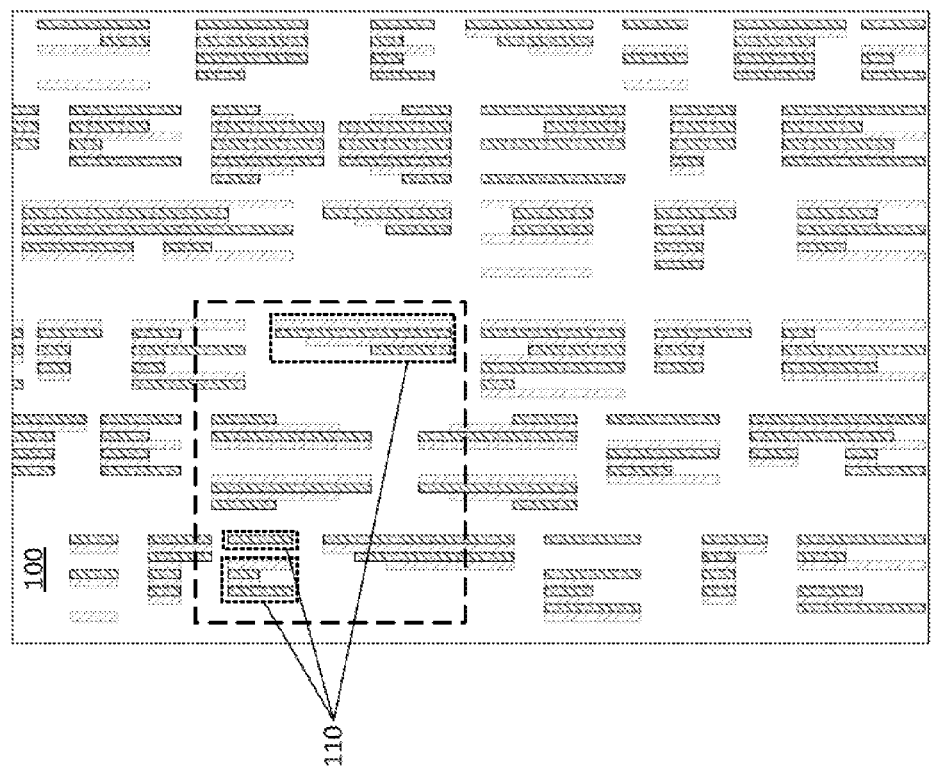

PATTERN DECOMPOSITION LITHOGRAPHY TECHNIQUES

BACKGROUND

Integrated circuit design in the deep-submicron process nodes (e.g., 32 nm and beyond) involves a number of non-trivial challenges, and circuits incorporating microelectronic components generated by patterning techniques have faced particular complications at these levels, such as those with respect to achieving small device features. Continued process scaling will tend to exacerbate such problems.

BRIEF DESCRIPTION OF THE DRAWINGS

FIG. 3A illustrates a schematic of the example target photoresist pattern of FIG. 2A to he formed on a substrate at a given process node, the pattern decomposed in accordance with an embodiment of the present invention.

FIG. 3B illustrates a partial view of a mask pattern configured in accordance with an embodiment of the present invention, the view corresponding to the portion of FIG. 3A enclosed by the dashed box therein.

Figure 1D:
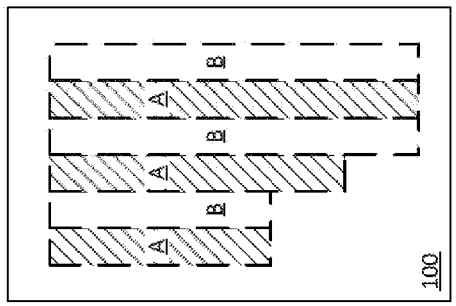
FIGS. 1B, 1C, and 1D illustrate an example pre-OPC decomposition of the target photoresist feature of FIG. 1A, in accordance with an embodiment of the present invention.

As will he appreciated, the figures are not necessarily drawn to scale or intended to limit the claimed invention to the specific configurations shown. For instance, while some figures generally indicate straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for realizing a two-dimensional target lithography feature/pattern by decomposing (splitting) it into multiple unidirectional target features that, when aggregated, substantially (e.g., fully) represent the original target feature without leaving an unrepresented remainder (e.g., a whole-number quantity of unidirectional target features). The unidirectional target features may he arbitrarily grouped such that, within a grouping, all unidirectional target features share a common target width value. Where multiple such groupings are provided, individual groupings may or may not have the same common target width value. In some cases, a series of reticles is provided, each reticle having a mask pattern correlating to a grouping of unidirectional target features. Exposure of a photoresist material via the aggregated series of reticles substantially (e.g., fully) produces the original target feature/pattern. The pattern decomposition techniques may be integrated into any number of patterning processes, such as litho-freeze-litho-etch and litho-etch-litho-etch patterning processes.

General Overview

Conventional pattern splitting processes are associated with a number of non-trivial issues. For instance, conventional approaches normally result in a substantial degree of corner rounding variation (e.g., it is impossible to make the same corner rounding on all corners via conventional techniques) as a function of the shape of the pattern and of the wavelength of the lithographic light used. As a result, the electrical properties and/or other characteristics of the circuit/device being fabricated may be impaired. Also, with conventional approaches, there is an inability to pattern both a narrow isolated line and a narrow isolated space in only two patterning steps. These and other complications impose undesirable restrictions on design and manufacturing processes.

Some processes that are used to create tight pitch lithography patterns, such as spacer-based double patterning (SBDP) and self-aligned double patterning (SADP), typically generate long-range, regular, repeating grids that are selectively cut or protected in order to create semiconductor devices. However, this selective cutting/protecting has a number of attendant complications (e.g., errors in optical proximity correction, in lithography/development, in etching, in optional photoresist freezing, and in optional shrinking), particularly when the generated grid is below the resolution of the lithographic patterning equipment (e.g., less than about 80 nm for 193-nm immersion lithography). In some cases, the cutting pattern may be split into two or more reticles, but the pattern splitting algorithms can be highly complex and impose restrictive design rules. Furthermore, the resulting split patterns create shapes that vary significantly in their interior corner rounding, which leads to undesirable variability in the length of the cut pattern on the wafer/substrate.

Thus, and in accordance with an embodiment of the present invention, a method is provided for realizing a target two-dimensional lithography feature by decomposing (splitting) it into multiple unidirectional target features that, when aggregated, substantially (e.g., fully) represent the original target feature without leaving an unrepresented remainder (e.g., the quantity of unidirectional target features is a whole number). In some embodiments, a given photoresist feature/pattern (e.g., a two-dimensional feature) may be decomposed into two or more comparatively simpler unidirectional features of a given width.

In some embodiments, the target two-dimensional feature may be decomposed into a quantity of unidirectional target features of a single target width (a commonly shared value). In some such embodiments, the total quantity of unidirectional target features may be arbitrarily divided and grouped into two or more groupings such that, within a group, all unidirectional target features share a common target width value. When aggregated, the groupings substantially (e.g., fully) represent the target two-dimensional feature without leaving an unrepresented remainder (e.g., the quantity of unidirectional target features across all groupings is a whole number).

In other embodiments, the target two-dimensional feature may be decomposed into a quantity of unidirectional target features such that any two unidirectional target features do not necessarily have the same target width value. In some such embodiments, the total quantity of unidirectional target features may be arbitrarily divided and grouped into two or more groupings such that, within a group, all unidirectional target features share a common target width value, but any two groupings do not necessarily have the same target width value. When aggregated, the groupings substantially (e.g., fully) represent the target two-dimensional feature without leaving an unrepresented remainder (e.g., the quantity of unidirectional target features across all groupings is a whole number).

In some embodiments, a series of two or more photomasks (reticles) may be provided such that each reticle has a mask pattern correlating to a grouping of unidirectional target features. In some example embodiments, a given grouping may be implemented in the mask pattern of a first reticle while another given grouping may be implemented in the mask pattern of a second reticle. Any number of arbitrary groupings (unidirectional target features of a single target width or differing target widths) may be implemented in an arbitrary number of reticles, as appropriate for a given application. As will be appreciated in light of this disclosure, one or more suitable resolution enhancement techniques/processes (e.g., optical proximity correction, OPC; sub-resolution. assist features, SRAFs) may be implemented with a given reticle to assist with accurately translating a grouping of unidirectional target features from design to printing/development on a substrate or other surface suitable for photoresist patterning. In some embodiments, exposure of a photoresist material via the aggregated series of reticles may substantially (e.g., fully) produce the original target feature (or multiple features, as in a pattern).

In accordance with one or more example embodiments, pattern decomposition techniques disclosed herein may be implemented, for example: (1) to minimize/prevent creation of interior corners and thus minimize/eliminate interior corner rounding errors typically associated with conventional double patterning processes; (2) to pattern interior and exterior corners of any shape or size with consistent (e.g., substantially the same) corner rounding on every corner, and in some cases allow for patterning of features having right angles (about or equal to 90°); and/or (3) to provide for stitching two or more groupings of unidirectional target features and thus allow for the patterning of narrow isolated photoresist lines and narrow isolated spaces simultaneously. Other suitable uses for various embodiments of the present invention will be apparent in light of this disclosure.

In some example embodiments, pattern decomposition techniques disclosed herein may be implemented, for instance, to split a gridded pattern (e.g., such as that produced by SBDP or SADP) into two or more reticles. In some cases, one or more embodiments of the present invention may he implemented as a design-for-manufacturing (DFM) trench/line pattern decomposition (splitting) method used to cut/protect, for example, a tight pitch pattern created by lithographic processes such as, but not limited to, SBDP and SADP.

As will be appreciated in light of this disclosure, the pattern decomposition techniques disclosed herein may he implemented in reticles that may be utilized with any lithography processes, including, but not limited to, lithography-freeze-lithography-etch (litho-freeze) or lithography-etch-lithography-etch (LELE) processes. Other suitable lithography processes which may implement one or more of the disclosed pattern decomposition techniques will be apparent, and the claimed invention is not intended to he limited to any single lithography process.

In some example embodiments, pattern decomposition techniques disclosed herein may provide a number of advantages/benefits over conventional approaches, including, for example: (1) improved critical dimension uniformity; (2) improved corner rounding (e.g., by eliminating all interior corners); (3) expanded process window; and/or (4) better overlay/registration margins. Furthermore, in some example cases, embodiments of the present invention may enable less restrictive design rules and/or better on-die area scaling, which may reduce the total number of fabrication processing modules and/or production costs. Other advantages/benefits of embodiments of the present invention will be apparent in light of this disclosure.

Pattern Decomposition Methodology

Figure 1G:
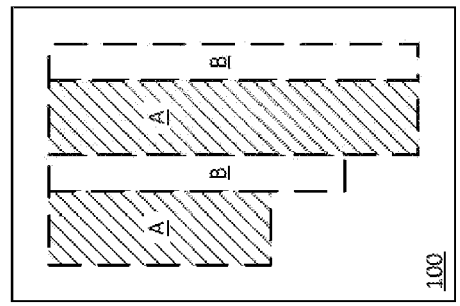
FIGS. 1E, 1F, and 1G illustrate another example pre-OPC decomposition of the target photoresist feature of FIG. 1A, in accordance with another embodiment of the present invention.
Figure 1C:
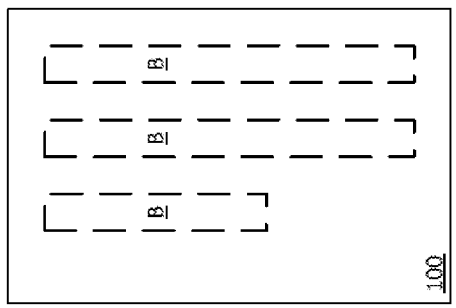
Figure 1F:
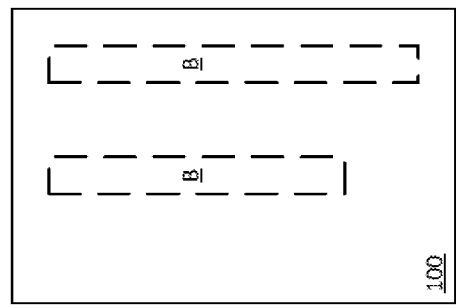
Figure 1B:
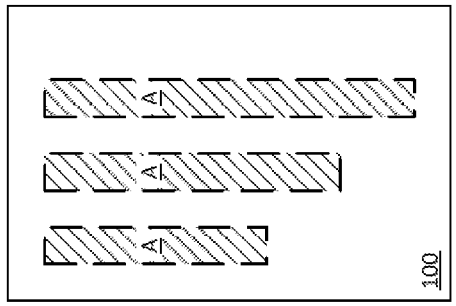
Figure 1E:
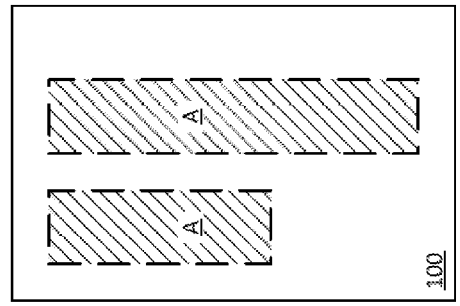
Figure 1A:
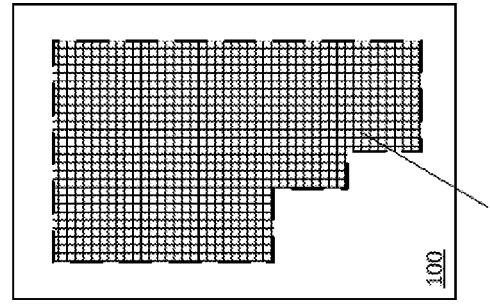
FIG. 1A is an example of a target two-dimensional photoresist feature to be patterned on a given substrate.

FIG. 1A is an example of a target two-dimensional photoresist feature 110 to he patterned on a given substrate 100. Target photoresist feature 110 need not be configured only as shown in the depicted example; for instance, target photoresist feature 110 need not he two-dimensional (e.g., it may be unidirectional) and may be of any desired geometry (e.g., a polygon) for a given application. Target photoresist feature 110 may he made of any resist material, including, but not limited to, an organic photoresist material (e.g., poly(methyl methacrylate), poly(dimethyl glutarimide), phenol formaldehyde resin, SU-8, or other polymer), an inorganic photoresist material (e.g., chalcogenide), a molecular photoresist material (e.g., truxene), a hybrid of the aforementioned, or any other resist material suitable for patterning on substrate 100. As will be appreciated in light of this disclosure, in some embodiments, target photoresist feature 110 may be deposited on substrate 100 using any suitable deposition methods.

Substrate 100 may be any material and have any geometry/shape suitable for patterning of one or more target photoresist features 110, depending on the given application. In some embodiments, substrate 100 may be, for example, a metal, silicon, germanium, III-V materials, oxide, nitride, or combinations thereof. In sonic embodiments, substrate 100 may be configured, for example, as a bulk substrate, a semiconductor-on-insulator (XOI, where X is a semiconductor material such as silicon, germanium, or germanium-enriched silicon), or a multi-layered structure. In some specific example instances, substrate 100 may be a semiconductor wafer. Other suitable substrate materials and/or configurations will depend on a given application and will be apparent in light of this disclosure.

Substrate 100 optionally may have disposed thereon, for example, an anti-reflective coating. In one or more embodiments, optional an anti-reflective coating may be disposed on at least a portion of a surface of substrate 110. The type of anti-reflective coating (if included) can be determined, for instance, by the particular lithographic process being employed and/or the application of the device being formed. In some such embodiments, the optional anti-reflective coating may be, for example, a bottom anti-reflective coating (BARC) or other suitable coating applied to reduce reflection of photolithographic light in the wavelength range of about, for example, 356 nm, 248 nm, 193 nm, or 13 nm (extreme ultraviolet). The optional anti-reflective coating may be of any desired thickness suitable for its purpose and may be, in some embodiments, in the range of about 200-4000 Å (20-100 nm), for example. The optional anti-reflective coating may be a single-film or multi-film coating. In some embodiments, the optional anti-reflective coating may be, for example, a carbon-based polymer or a spin-on glass (SOG). Other anti-reflective coating materials and/or deposition techniques suitable for a given application will be apparent in light of this disclosure (e.g., silicon nitride, silicon oxynitride, silicon carbide, titanium nitride, combinations thereof, or the like using, for instance, CVD, PECVD, PVD, ALD).

FIGS. 1B, 1C, and 1D illustrate an example pre-OPC decomposition of the target photoresist feature 110 of FIG. 1A, in accordance with an embodiment of the present invention. As can be seen, target photoresist feature 110 has been decomposed into several unidirectional target features A (as in FIG. 1B) and several unidirectional target features B (as in FIG. 1C). As will be appreciated, a given target photoresist feature 110 (two-dimensional or unidirectional) may be decomposed into one or more unidirectional target features A and/or one or more unidirectional target features B, for example. In the illustrated example embodiment, the unidirectional target features A and B have a single target width (a commonly shared value). However, as will be apparent in light of this disclosure and as is best illustrated by FIGS. 1E, 1F, and 1G discussed. below, unidirectional target features A and B (or other) need not have a mutually common single target width. In one or more embodiments, when unidirectional target features A and B are aggregated (as in FIG. 1D), they substantially (e.g., fully or otherwise within an acceptable tolerance) represent the original target photoresist feature 110 without leaving an unrepresented remainder (e.g., the quantity of unidirectional target features is a whole number). As will he appreciated, rounding of one or more ends of any given unidirectional target feature may occur as a result of the practicalities of processing conditions. In addition, a negligible unrepresented remained may be incurred, if acceptable to a given application.

Unidirectional target features A of a single target width may be grouped into an arbitrary target set (grouping A), for example. Similarly, unidirectional target features B of a single target width may be grouped into another arbitrary target set (grouping B), for example. In some embodiments, such as that illustrated in FIGS. 1B-1D, the width of the features of grouping A and of grouping B are substantially or identically equivalent; however, as previously noted, this need not be the case (as is discussed below in reference to FIGS. 1E-1G). The aggregation of grouping A and grouping B (and any arbitrary number of additional groupings, if provided) substantially (e.g., fully or otherwise within an acceptable tolerance) represents the original target photoresist feature 110 without leaving an unrepresented remainder (e.g., the quantity of unidirectional target features is a whole number).

FIGS. 1E, 1F, and 1G illustrate another example pre-OPC decomposition of the target photoresist feature 110 of FIG. 1A, in accordance with another embodiment of the present invention. As can be seen, target photoresist feature 110 has been decomposed into several unidirectional target features A (as in FIG. 1E) and several unidirectional target features B (as in FIG. 1F). As can be further seen in this example embodiment, the unidirectional target features A and B do not share a common single target width; rather, the width of unidirectional target features A is greater than the width of unidirectional target features B. Alternatively, as will be appreciated, unidirectional target features B very well could be greater in width than unidirectional target features A, in other example embodiments. In one or more embodiments, when unidirectional target features A and B are aggregated (as in FIG. 1G), they substantially (e.g., fully or otherwise within an acceptable tolerance) represent the original target photoresist feature 110 without leaving an unrepresented remainder (e.g., the quantity of unidirectional target features is a whole number). As will be appreciated, rounding of one or more ends of any given unidirectional target feature may occur as a result of the practicalities of processing conditions. The previous discussion with respect to the grouping of target features (e.g., grouping A, B, etc.) is equally applicable here.

In some embodiments, a given grouping of unidirectional target features (e.g., grouping A or grouping B, as in FIGS. 1B-1G, or other grouping) may be implemented, for instance, in a photomask (reticle). In some such embodiments, the reticle may include a mask pattern designed such that it approximates or otherwise best achieves development of a given grouping of unidirectional target features and thus substantially (e.g., fully or otherwise within an acceptable tolerance) represents an associated portion of the original target photoresist feature 110. As will be appreciated, the mask pattern of a given reticle may have, for example, light non-transmissive (opaque) regions (e.g., of chrome) and light transmissive (transparent) regions (e.g., of quartz). Electromagnetic radiation from a light source (e.g., ultra-violet or deep ultra-violet light, etc.) is focused via an optical lens system and then applied to the reticle. The light both passes through the transparent mask pattern regions, thus exposing the underlying photoresist material (such as that which may be formed or otherwise disposed on substrate 100), and is blocked by the opaque mask pattern regions, thus leaving those underlying portions of the photoresist layer unexposed. Depending on the specific process utilized, either the exposed or the non-exposed regions of the photoresist material then may be removed, thereby leaving behind a resist pattern (e.g., the target photoresist feature 110, in part or in whole) on the substrate 100, which in turn allows for subsequent processing (e.g., etching, depositing, and/or other typical semiconductor processes) of the substrate 100.

Multiple reticles (each with an attendant mask pattern representing an associated portion of the target photoresist feature 110) may be utilized, in accordance with an embodiment of the present invention. For instance, in one specific example embodiment, a series of two reticles may be implemented one portion of the target photoresist feature 110 (e.g., grouping) per reticle. However, in. one or more other example embodiments, any suitable quantity of reticles may be utilized depending on a given application and feature complexity. Most features can be represented using, for instance, two to six reticles, but again, there is no limit on the quantity of reticles that may be used. When aggregated, the reticles substantially (e.g., fully or otherwise within an acceptable tolerance) represent the original target photoresist feature 110 without leaving an unrepresented remainder (e.g., the quantity of unidirectional target features is a whole number). Upon utilizing the reticles to develop a given photoresist material disposed on a substrate 100, one or more target photoresist features 110 (two-dimensional, unidirectional, or other achievable feature/pattern) may be formed thereon, in accordance with an embodiment of the present invention. The reticles (each defining a portion of the target photoresist feature 110 or other photoresist pattern to be formed on substrate 100) may be individually selected for exposure, as desired.

Regardless of whether all groupings of unidirectional target features (e.g., grouping A and grouping B, as well as any additional groupings, if provided) share a common target width value or at least one grouping of unidirectional target features differs in target width value from another one or more groupings, the groupings may be implemented in a correspondingly appropriate quantity of reticles (e.g., one grouping of unidirectional target features having a commonly shared single target width per reticle).

In some cases, one or more suitable resolution enhancement techniques/processes (e.g., optical proximity correction, OPC; sub-resolution assist features, SRAFs) may be implemented with a given reticle to assist with accurately translating one or more (e.g., a grouping of) unidirectional target features from design to printing/development on a substrate or other surface suitable for photoresist patterning. As will be appreciated, OPC may be utilized in generating the mask pattern of a given reticle to counteract limitations of the photolithography equipment being used to develop the photoresist pattern (e.g., to form target photoresist feature 110, in part or in whole) on a given substrate 100 and thus better approximate (e.g., as much as practicable) the layout of the original target photoresist feature 110 in the substrate 100 upon printing. For example, OPC may assist with maintaining edge placement integrity of the target photoresist feature 110 to be patterned on the substrate 100, in some embodiments.

In some cases, decomposing a given target photoresist feature 110 into one or more unidirectional target features may produce errors in subsequent processing stages (e.g., such as in actual lithography/development, etching, optional freezing, and/or optional shrinking). In some such cases, implementation of OPC may help to minimize or otherwise mitigate these errors and thus, for example, improve critical dimension uniformity, in accordance with an embodiment of the present invention.

Figure 2B:
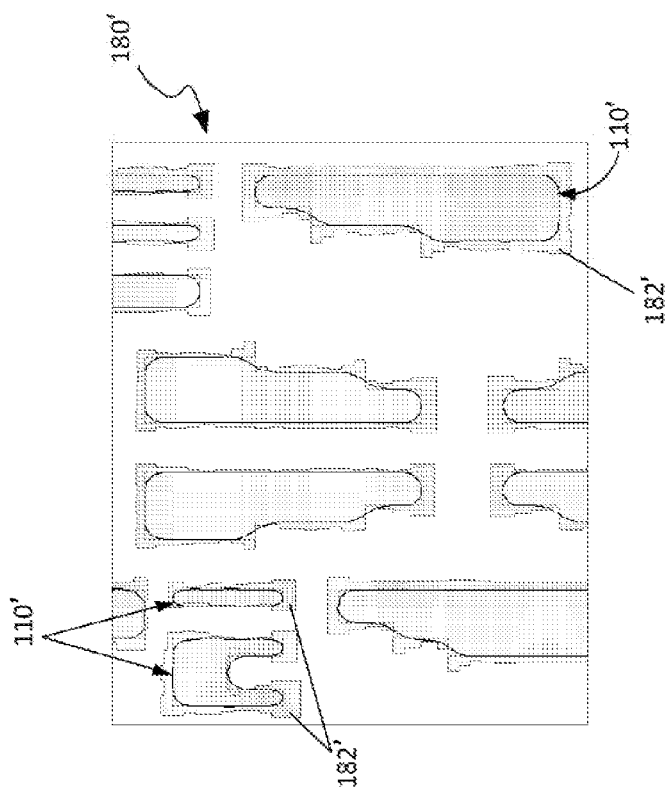
FIG. 2B illustrates a partial view of a conventional mask pattern, the view corresponding to the portion of FIG. 2A enclosed by the dashed box therein.
Figure 2A:
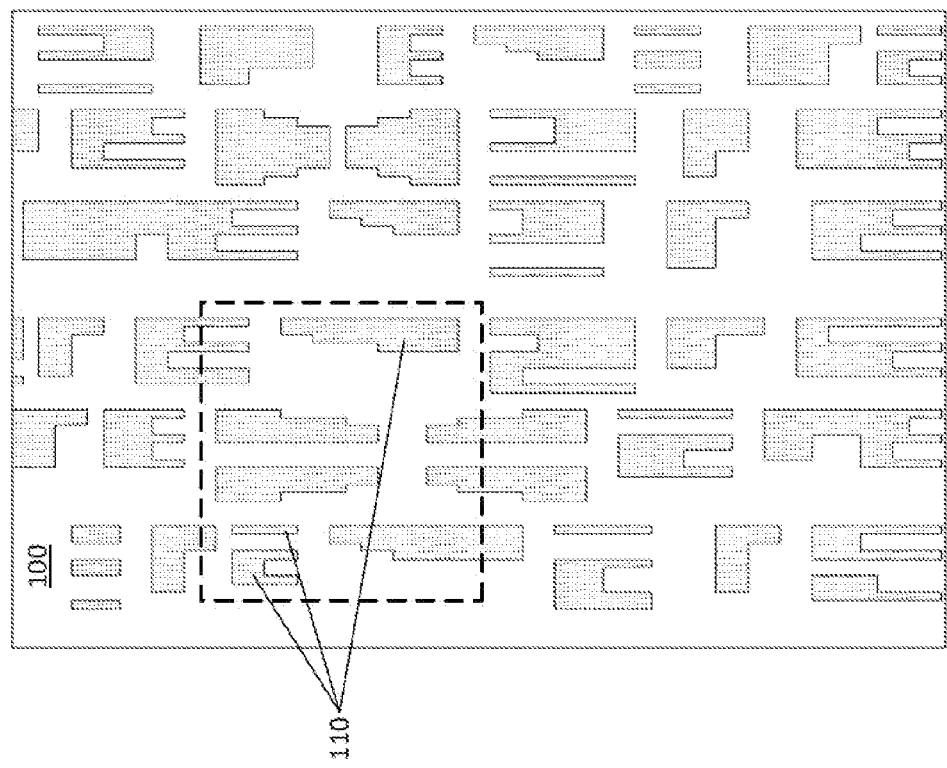
FIG. 2A illustrates a schematic of an example target photoresist pattern to be funned on a substrate at a given process node.

FIG. 2A illustrates a schematic of an example target photoresist pattern to be formed on a substrate 100 at a given process node. As can be seen, the depicted example pattern includes a number of target photoresist features 110 (unidirectional and two-dimensional). In the depicted example, a number of the target photoresist features 110 have multiple right angles and several have one or more interior corners. As discussed below with reference to FIG. 2B, conventional approaches may not reproduce such target photoresist features on a given substrate to a sufficient degree of accuracy, depending on desired specifications.

FIG. 2B illustrates a partial view of a conventional mask pattern 180', the view corresponding to the portion of FIG. 2A enclosed by the dashed box therein. This conventional mask pattern 180' is designed for use with a single conventional reticle and so does not implement any of the pattern decomposition techniques disclosed herein. As can be seen, the depicted conventional mask pattern 180' employs optical proximity correction (OPC) 182' (the cross-hatch shaded geometry) in an attempt to approximately reproduce the target photoresist features 110 of FIG. 2A. Predictive photoresist contours 110' demonstrate the predicted approximate reproduction achievable by utilizing a reticle implementing conventional mask pattern 180' (with OPC 182') to expose a photoresist material disposed on substrate 100. As is evident, attempting to pattern target photoresist features 110 with conventional mask pattern 180' results in a substantial degree of corner rounding variation (e.g., it is impossible to make the same corner rounding on all corners via conventional techniques) as a function of the shape (e.g., drawn critical dimension, jogs, etc.) of the features 110 and of the wavelength of the lithographic light used. For example, the upside-down horseshoe-like photoresist feature 110' in the upper left corner of FIG. 2B clearly demonstrates substantial interior corner rounding as results from conventional methods. Such corner rounding and variation may degrade or otherwise be detrimental to the electrical properties and/or other characteristics of the circuit/device being fabricated.

FIG. 3A illustrates a schematic of the example target photoresist pattern of FIG. 2A to he formed on a substrate at a given process node, the pattern decomposed in accordance with an embodiment of the present invention. As can be seen in this depicted example case, the pattern of target photoresist features 110 (some example features in the figure are encapsulated in dotted lines for clear comparison with FIG. 2A) has been decomposed, in accordance with an embodiment of the present invention, into a quantity of unidirectional target features of a single target width (a commonly shared value). Here, the total quantity of unidirectional target features has been arbitrarily divided and grouped into two groupings such that: (1) within a group, all unidirectional target features share a common target width value; and (2) the target width value is the same for both groupings. However, as previously discussed with reference to FIG. 1B-1G, the target width value need not be the same for all groupings. When aggregated (as shown in FIG. 3A), the groupings substantially (e.g., fully or otherwise within an acceptable tolerance) represent the target photoresist pattern of FIG. 2A without leaving an unrepresented remainder (e.g., the quantity of unidirectional target features across all groupings is a whole number).

FIG. 3B illustrates a partial view of a mask pattern 180" configured in accordance with an embodiment of the present invention, the view corresponding to the portion of FIG. 3A enclosed by the dashed box therein. Mask pattern 180" is designed for implementation in at least one reticle (of a series of two or more reticles) configured in accordance with an embodiment of the present invention. As can be seen, the depicted example mask pattern 180" represents the lighter-shaded portions of target photoresist features 110 shown in FIG. 3A and employs optical proximity correction (OPC) 182" (the cross-hatched shaded geometry) to more approximately reproduce the individual unidirectional target features (as in FIG. 3A) of a given grouping for forming/developing the target photoresist features 110 of FIG. 2A. Furthermore, in the depicted example embodiment, the mask pattern 180" employs several sub-resolution assist features (SRAFs) 150" to assist with that reproduction. Predictive photoresist contours 110" demonstrate the predicted approximate reproduction of a first portion (e.g., a first half) of target photoresist pattern 110 achieved by utilizing a reticle implementing mask pattern 180" (with OPC 182" and SRAFs 150") to expose a photoresist material disposed on substrate 100. As compared to the conventional mask pattern 180' of FIG. 2B, here there is substantially less corner rounding variation regardless of the shape (e.g., drawn critical dimension, jogs, etc.) of the features 110 of the pattern or the wavelength of lithographic light used.

As previously explained, decomposition of the target photoresist features 110 in accordance with an embodiment of the present invention may, for example: (1) improve critical dimension uniformity; (2) improve corner rounding such as by minimizing/eliminating interior and/or exterior corners that normally would result from conventional methods; (3) expand the limits of the process window; and/or (4) provide better overlay/registration margins. Other advantages/benefits of embodiments of the present invention will be apparent in light of this disclosure, and the claimed invention is not intended to be limited to these example benefits/uses.

Patterning Methodology

Figure 4:
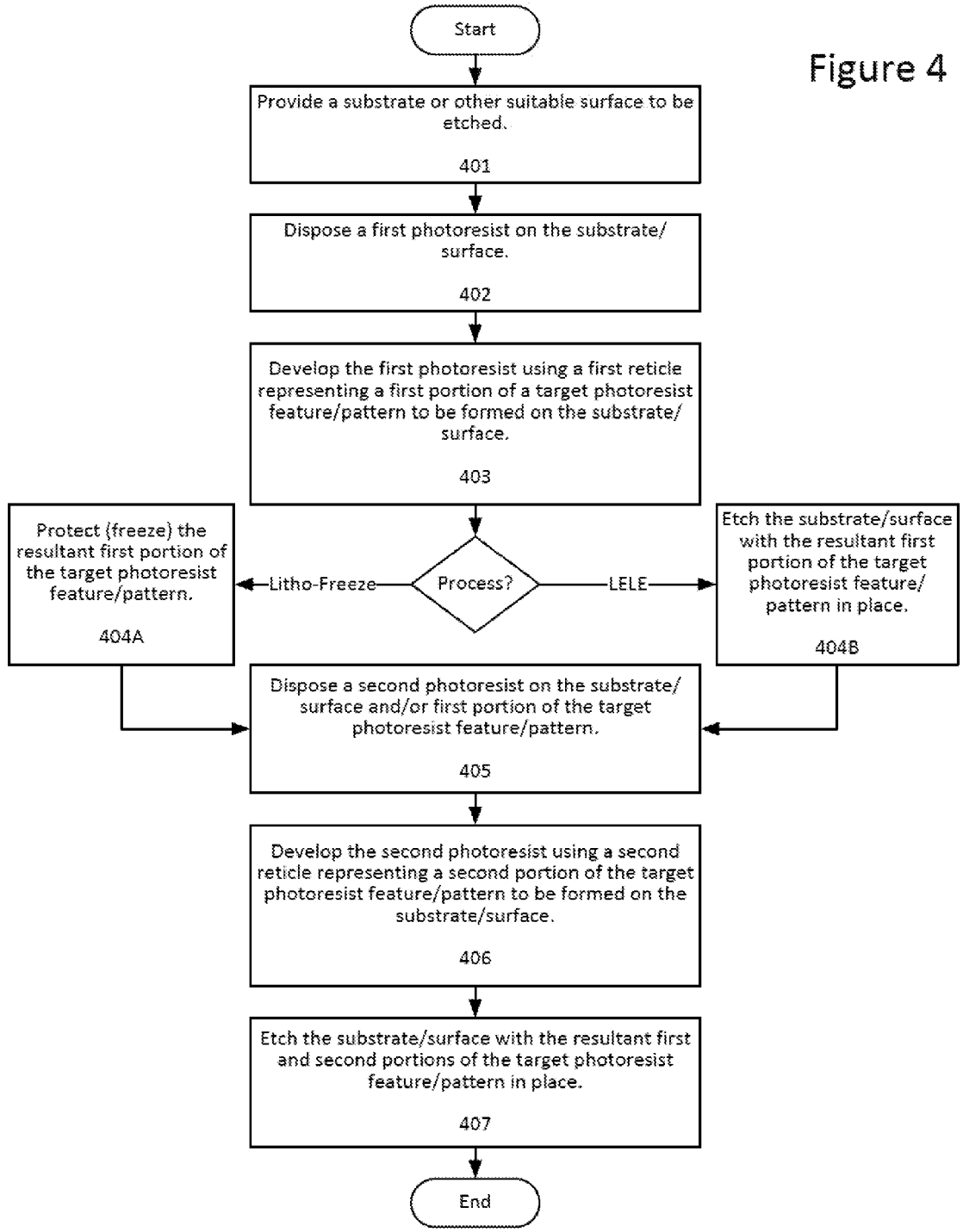
FIG. 4 illustrates an example lithography patterning process flow implementing pattern decomposition, in accordance with an embodiment of the present invention.

FIG. 4 illustrates an example lithography patterning process flow implementing pattern decomposition, configured in accordance with an embodiment of the present invention. As in block 401, provide a substrate or other suitable surface to be etched, and, as in block 402, dispose a first photoresist on the substrate/surface. The description provided above with reference to FIGS. 1A-1G regarding the substrate/surface and photoresist materials, formation, and configurations applies equally as well here in reference to the example process of FIG. 4.

As in block 403, develop the first photoresist using a first reticle representing a first portion of a target photoresist feature/pattern to be formed on the substrate/surface. The first reticle may be configured and/or utilized in accordance with any one or more of various embodiments of the present invention described herein. Numerous variations will be apparent.

At this juncture in the example process flow of FIG. 4, a decision may be made as to whether to proceed with integrating a litho-freeze-litho-etch (litho-freeze) process or a litho-etch-litho-etch (LELE) process, in accordance with an embodiment of the present invention.

If integration of a litho-freeze process is desired, the process flow continues, as in block 404A, with protecting (freezing) the resultant first portion of the target photoresist feature/pattern. The freezing process may be implemented using any suitable conventional or custom processes, as will be apparent in light of this disclosure. In an example embodiment, the physical and/or chemical interaction between the first frozen resist feature and the second exposed resist feature (as in blocks 405 and 406, discussed below) may be exploited to generate, for example, two-dimensional patterns having better overlay margins In some such example cases, this may minimize/eliminate double-etching concerns due to patterning/overlay overlaps normally associated with conventional patterning approaches.

If instead integration of a LELE process is desired, the process flow continues, as in block 404B, with etching the substrate/surface with the resultant first portion of the target photoresist feature/pattern in place. In some example embodiments, each lithography step of the LELE process may be tuned through the use of an external shrink process, which may be accomplished, for example, during the etch (e.g., critical dimension reduction etch) and/or by using other chemical/physical methods to reduce critical dimension (e.g., chemical, implant, spacer-based pitch division, or any other suitable conventional or custom processes). Thus, the techniques provided herein are compatible with any number of shrink processes. Also, the critical dimension(s) of a given photoresist pattern are not subjected to a freezing process, and thus remain unaffected by such processing, as may sometimes be an issue.

As will be appreciated, the choice between integrating a litho-freeze process or LELE process will be determined by a given application. However, regardless of any such processing that may be used in conjunction with techniques provided herein, one or more of the following may be realized in accordance with some embodiments: (1) uniform and reduced corner rounding across the reticle as compared to a conventional single reticle patterning; (2) smaller line/space critical dimensions in isolated and nested pattern contexts; and/or (3) smaller, isolated trenches.

Regardless of the choice to integrate a litho-freeze or LELE process (or other suitable process), the example process flow of FIG. 4 continues as in block 405, with disposing a second photoresist on the substrate/surface and/or the first portion of the target photoresist feature/pattern. As before, the description provided above with reference to FIGS. 1A-1G regarding the photoresist materials, formation, and configurations applies equally as well here in reference to the example process of FIG. 4.

As in block 406, develop the second photoresist using a second reticle representing a second portion of the target photoresist feature/pattern to be formed on the substrate/surface. The second reticle may be configured and/or utilized in accordance with any one or more of the various embodiments described herein and may be designed, in some such embodiments, so as to complement the first reticle in further partially or fully representing the target photoresist feature/pattern without leaving an unrepresented remainder or otherwise leaving only a negligible remainder. In some instances, the second photoresist may be the same material or a different material as compared to the first photoresist.

As in block 407, etch the substrate/surface with the resultant first and second portions of the target photoresist feature/pattern in place. In a given application, any quantity and/or type of features may he etched into the substrate/surface (e.g., holes, trenches, two-dimensional features, other etchable geometric features, etc.). As will be appreciated, a wet and/or dry etch process, for example, may be implemented with a given etch chemistry suitable for a given application. Anisotropic etching and/or isotropic etching may he implemented, in accordance with one or more embodiments of the present invention, as desired for achieving a given feature and/or etching directionality for a given substrate/surface. Other suitable etching processes will be apparent in light of this disclosure, and the claimed invention is not intended to be limited to any single etching method/technique.

In various embodiments, one or more of the disclosed techniques may be used to implement various integrated circuit structures/devices that may be manufactured as discrete components or on-chip and at, for example, the deep-submicron process levels/nodes, including the 45 nm process node and beyond (e.g., 32 nm, 22 nm, 16 nm, 14 nm, and beyond). Such structures/devices can be used in any number of electronic systems, as will be apparent in light of this disclosure.

Example System

Figure 5:
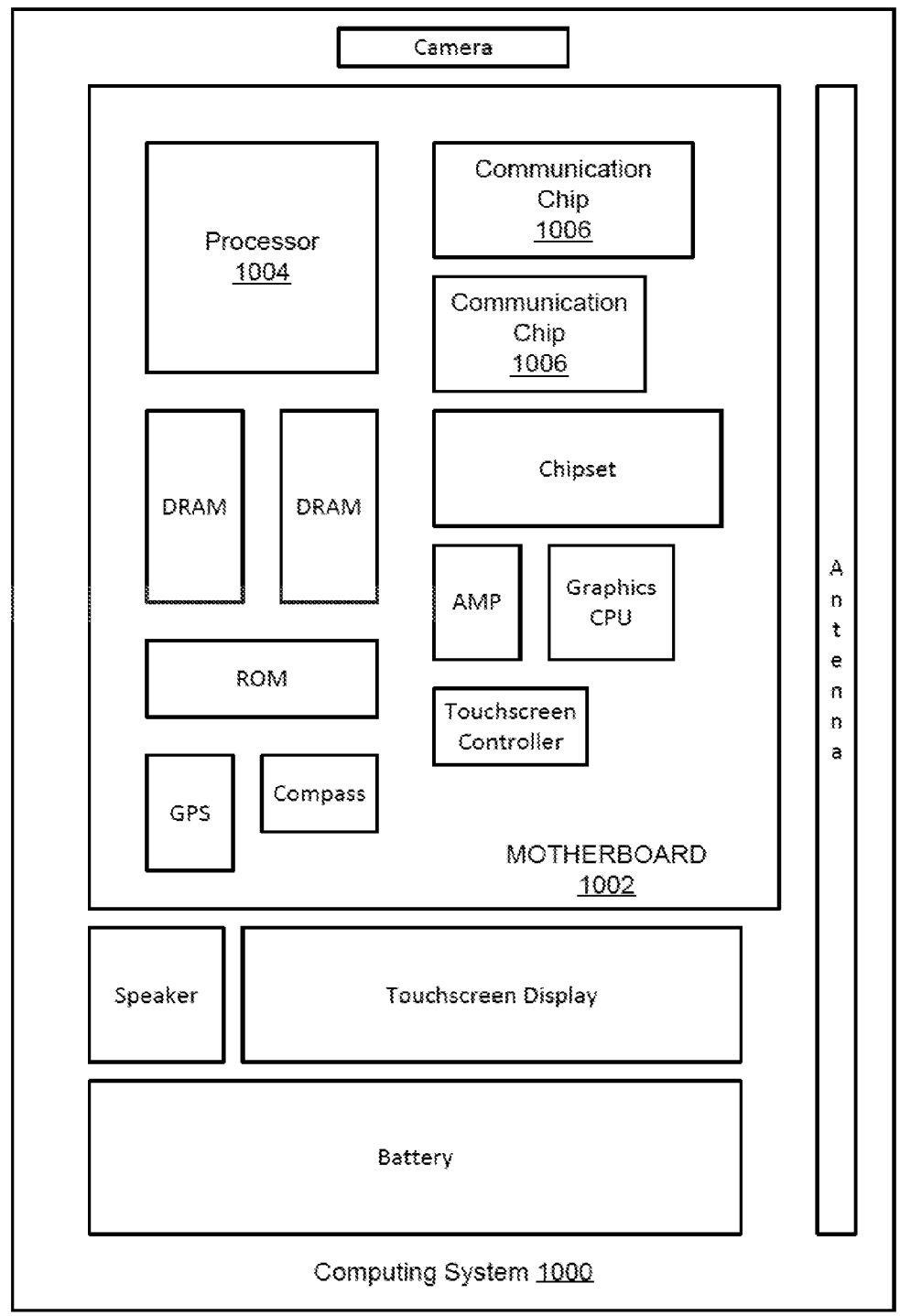
FIG. 5 illustrates a computing system implemented with integrated circuit structures or devices formed by pattern decomposition in accordance with an example embodiment of the present invention.

FIG. 5 illustrates a computing system 1000 implemented with integrated circuit structures or devices formed by pattern decomposition in accordance with an example embodiment of the present invention. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or features (e.g., conductive runs, metal gates, electrodes, etc.) formed by pattern decomposition in accordance with an example embodiment of the present invention. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more integrated circuit structures or features formed by pattern decomposition, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or features formed by pattern decomposition as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more integrated circuit structures or devices formed by pattern decomposition, as described herein (e.g., transistors, memory arrays, amplifiers, conductors, etc., as variously described herein).

Numerous embodiments will he apparent, and features described herein. can. be combined in any number of configurations. One example embodiment of the present invention provides a method that includes disposing a first photoresist on a substrate, developing the first photoresist using a first reticle having a mask pattern representing a first portion of a two-dimensional target photoresist feature to he formed on the substrate, disposing a second photoresist on the substrate and/or the first portion of the two-dimensional target photoresist feature, developing the second photoresist using a second reticle having a mask pattern representing a second portion of the two-dimensional target photoresist feature, and etching the substrate with the first and second portions of the two-dimensional target photoresist feature thereon. In some cases, after developing the first photoresist, the method further includes at least one of protecting the first portion of the target photoresist feature and/or etching the substrate with the first portion of the two-dimensional target photoresist feature thereon. In some cases, at least one unidirectional target photoresist feature is formed on the substrate while carrying out the method. In some cases, aggregation of the first and second portions fully represents the two-dimensional target photoresist feature without leaving an unrepresented remainder. In some cases, the first portion comprises a first grouping of at least one unidirectional target feature having a first target width, and the second portion comprises a second grouping of at least one unidirectional target feature having a second target width. In some cases, the first target width and the second target width are different. In some cases, the method is integrated into a litho-freeze-litho-etch process. In some cases, the method is integrated into a litho-etch-litho-etch process. In some cases, the method at least one of reduces corner rounding across a given reticle, provides small line/space critical dimensions in isolated and/or nested pattern contexts, and/or provides small, isolated trenches. In some cases, the method at least one of improves critical dimension uniformity, improves corner rounding, expands process window, and/or improves overlay/registration margins. In some cases, the method further includes the preliminary process of decomposing the two-dimensional target photoresist feature into two or more unidirectional target features, wherein aggregation of the unidirectional target features fully represents the two-dimensional target photoresist feature without leaving an unrepresented remainder. In some cases, the method further includes allotting at least one unidirectional target feature to a first grouping and at least one unidirectional target feature to a second grouping, wherein within a given grouping, all unidirectional target features have a single target width. In some cases, the method at least one of minimizes creation of interior corners, minimizes interior corner rounding errors, provides for patterning interior and/or exterior corners of any shape and/or size with consistent corner rounding, provides for patterning of photoresist features having substantially right angles, and/or provides for stitching two or more groupings of unidirectional target features to pattern narrow isolated photoresist lines and narrow isolated spaces simultaneously. In some cases, an integrated circuit is fabricated using the method. In some such cases, an electronic device includes one or more of the integrated circuit. In some such cases, the electronic device comprises at least one of a memory circuit, a communication chip, a processor, and/or a computing system.

In another example embodiment of the present invention, a set of lithography reticles is provided which includes a first reticle configured with a mask pattern representing a first portion of a two-dimensional target photoresist feature to be formed on a substrate, and a second reticle configured with a mask pattern representing a second portion of the two-dimensional target photoresist feature, wherein the set when aggregated fully represents the target photoresist feature without leaving an unrepresented remainder. In some cases, a given mask pattern represents a portion of a pattern of target photoresist features to be formed on the substrate. In some cases, a given mask pattern represents at least one unidirectional and/or two-dimensional target photoresist feature. In some cases, a given mask pattern is implemented with optical proximity correction and/or at least one sub-resolution assist feature. In some cases, the set comprises 2-6 reticles. In some cases, a lithography system is configured to use the set of lithography reticles.

In another example embodiment of the present invention, a set of lithography reticles is provided which includes a first reticle configured with a mask pattern representing a first portion of a two-dimensional target photoresist feature to be formed on a substrate, wherein the mask pattern comprises one or more unidirectional target features of a first target width, and a second reticle configured with a mask pattern representing a second portion of the two-dimensional target photoresist feature, wherein the mask pattern comprises one or more unidirectional target features of a second target width, wherein the mask patterns are implemented with optical proximity correction and/or at least one sub-resolution assist feature, and wherein the set when aggregated fully represents the two-dimensional target photoresist feature without leaving an unrepresented remainder. In some cases, the first target width and the second target width are different. In some cases, at least one unidirectional target photoresist feature to he formed on the substrate is fully represented by the mask pattern of the first or the second reticle. In some cases, a lithography system is configured to use the set of lithography reticles.

The foregoing description of the embodiments of the invention has been presented for the purposes of illustration and description. It is not intended to he exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method comprising:
    disposing a first photoresist on a substrate;
    forming a first portion of a two-dimensional target photoresist feature from the first photoresist by:
        exposing the first photoresist to electromagnetic radiation through a first reticle having a first mask pattern representing the first portion of the two-dimensional target photoresist feature, wherein the first mask pattern comprises only one or more unidirectional features, wherein each unidirectional feature of the first mask pattern is of a first single target width; and
        removing one or more exposed or non-exposed portions of the first photoresist;
    disposing a second photoresist on at least one of the substrate and the first portion of the two-dimensional target photoresist feature;
    forming a second portion of the two-dimensional target photoresist feature from the second photoresist by:
        exposing the second photoresist to electromagnetic radiation through a second reticle having a second mask pattern representing the second portion of the two-dimensional target photoresist feature, wherein the second mask pattern comprises only one or more unidirectional features, wherein each unidirectional feature of the second mask pattern is of a second single target width; and
        removing one or more exposed or non-exposed portions of the second photoresist; and
    etching the substrate having the first and second portions of the two-dimensional target photoresist feature thereon.

2. The method of claim 1, wherein after forming the first portion of the two-dimensional target photoresist feature, the method further comprises at least one of:
    protecting the first portion of the two-dimensional target photoresist feature; and
    etching the substrate having the first portion of the two-dimensional target photoresist feature thereon.

3. The method of claim 2, wherein the protected first portion of the two-dimensional target photoresist feature at least one of physically and chemically interacts with the second portion of the two-dimensional target photoresist feature.

4. The method of claim 1, wherein at least one unidirectional target photoresist feature is formed on the substrate while carrying out the method.

5. The method of claim 1, wherein the first and second portions of the two-dimensional target photoresist feature, in the aggregate, fully represent the entirety of the two-dimensional target photoresist feature.

6. The method of claim 1, wherein:
    the first portion of the two-dimensional target photoresist feature comprises a first grouping of at least one unidirectional target feature having the first single target width; and
    the second portion of the two-dimensional target photoresist feature comprises a second grouping of at least one unidirectional target feature having the second single target width.

7. The method of claim 6, wherein the first single target width and the second single target width are different.

8. The method of claim 6, wherein the first single target width and the second single target width are the same.

9. The method of claim 1, wherein the method is integrated into a lithography-freeze-lithography-etch process.

10. The method of claim 1, wherein the method is integrated into a lithography-etch-lithography-etch process.

11. The method of claim 1 further comprising the preliminary process of decomposing the two-dimensional target photoresist feature into two or more unidirectional target features, wherein the two or more unidirectional target features, in the aggregate, fully represent the entirety of the two-dimensional target photoresist feature.

12. The method of claim 11 further comprising allotting at least one of the unidirectional target features to a first grouping and at least one of the unidirectional target features to a second grouping, wherein within a given grouping, all constituent unidirectional target features have a single target width.

13. The method of claim 1, wherein at least one of the first mask pattern and the second mask pattern is implemented with at least one of optical proximity correction (OPC) and at least one sub-resolution assist feature (SRAF).

14. The method of claim 1, wherein an integrated circuit is fabricated using the method.

15. The method of claim 14, wherein one or more of the integrated circuit of claim 14 are part of an electronic device.

16. The method of claim 15, wherein the electronic device comprises at least one of a memory circuit, a communication chip, a processor, and a computing system.

* * * * *